United States Patent [19]

Kurtz

[11] Patent Number: 4,724,030
[45] Date of Patent: Feb. 9, 1988

[54] ADHESIVE AIDED TRANSFER OF CHIPS

[75] Inventor: Samuel E. Kurtz, Muhlenberg, Pa.

[73] Assignee: American Telephone and Telegraph Company AT&T Technologies, Inc., Berkeley Heights, N.J.

[21] Appl. No.: 735,012

[22] Filed: May 17, 1985

[51] Int. Cl.⁴ .............................. C09J 3/14; C09J 5/06
[52] U.S. Cl. .................................. 156/307.3; 156/330
[58] Field of Search ............... 156/578, 569, 571, 572, 156/60, 63, 330, 307.3; 294/1.1, 1.2

[56] References Cited

U.S. PATENT DOCUMENTS

| | | | |
|---|---|---|---|
| 2,610,882 | 9/1952 | Sutliffe | 294/1 |
| 3,132,887 | 5/1964 | Martinez | 294/1.2 |
| 3,457,131 | 7/1969 | Rosenstein | 156/578 |
| 3,611,744 | 10/1971 | Sutz | 62/303 |
| 3,658,618 | 4/1972 | Gramann | 156/235 |
| 3,727,775 | 4/1973 | Beazley | 214/1 BC |
| 3,797,875 | 3/1974 | den Hamer | 294/1 R |
| 3,864,993 | 2/1975 | Hovind | 81/3 R |
| 3,933,187 | 1/1976 | Marlinski | 141/392 |
| 3,963,551 | 6/1976 | Marlinski | 156/295 |
| 4,073,530 | 2/1978 | Seidler | 294/19 R |
| 4,209,358 | 6/1980 | DiLeo et al. | 156/293 |
| 4,283,839 | 8/1981 | Gursky | 29/589 |
| 4,314,870 | 2/1982 | Ishida et al. | 156/272 |
| 4,375,606 | 3/1983 | DiLeo et al. | 313/499 |
| 4,478,668 | 10/1984 | Gau | 156/571 |

Primary Examiner—Donald E. Czaja
Assistant Examiner—J. Davis
Attorney, Agent, or Firm—Roderick B. Anderson; Douglas J. Kirk

[57] ABSTRACT

A transfer pin (40) simultaneously transfers a die (10) to an adhesively coated, electrically conductive cup (23) while depositing adhesive on the upper surface of the die for subsequent bonding.

5 Claims, 13 Drawing Figures

FIG. 4

ADHESIVE AIDED TRANSFER OF CHIPS

TECHNICAL FIELD

This invention relates to a method of fabricating a microelectric device.

BACKGROUND OF THE INVENTION

One well known technique for fabricating microelectric devices is described in U.S. Pat. No. 4,209,358 which issued on June 24, 1980 to DiLeo et al. which is assigned to the instant assignee and is incorporated by reference herein. In particular, that patent describes the bonding of a Light Emitting Diode (LED) die to the bottom of a small reflective, electrically conductive cap using an unfilled epoxy adhesive. Once the die is bonded within the cup additional wet adhesive is placed on the top portion of the die and an electrically conductive lead is placed in contact therewith to provide an electrical connection thereto. Typically a thin metal rod is dipped into the wet adhesive to form a small pool or droplet of adhesive on the end thereof which is then placed in contact with the bottom of the cup to place the droplet therein.

A hollow hypodermic-type needle is then placed in contact with the die and a vacuum drawn to hold the die which is then lifted and placed in contact with the adhesive in the bottom of the cup. The vacuum is released, the needle withdrawn and additional adhesive deposited on the top of the die with a thin metal rod as previously described in relation to the depositing of adhesive in the bottom of the cup.

Heretofore the LED dies were miniature, but managable, e.g., a cube of about 0.015 inch or longer on each side. However, the dies are becoming smaller, e.g., approximately 0.011 inch square by 0.014 inch high. Such dies have been found to be most difficult to transfer using the vacuum-needle approach. The vacuum needles have such a small inside diameter (e.g., 0.007 inch) that they can become readily clogged with dirt or adhesive resulting in the die not being picked up or dropped during the transfer process which decreases the yield.

Accordingly, there is a need for an improved method of transferring and applying adhesive to the LED dice in which the transfer yields are substantially improved.

SUMMARY OF THE INVENTION

The instant invention overcomes the foregoing problem with a method of fabricating a microelectric assembly. The method includes the steps of: applying a wet adhesive to the end of a transfer pin; moving the pin to place the adhesive thereon in contact with an article; transferring the pin, with the article in adhesive contact therewith, to place the article on a terminal having previously deposited wet adhesive thereon; and removing the pin from the wet adhesive to leave the article on the adhesively coated terminal with adhesive on the upper surface thereof.

DETAILED DESCRIPTION

The present invention is described primarily in terms of bonding a LED die to an electrically conductive lead and/or a lead frame. However, it will be understood that such description is exemplary only and is for purposes of exposition and not for purposes of limitation. It will be readily appreciated that the inventive concept described is equally applicable to bonding any suitable microelectric components together. It should be further appreciated that the inventive concept described is equally applicable to bonding a single assembly or simultaneously bonding a multitude of components.

Figure 1:
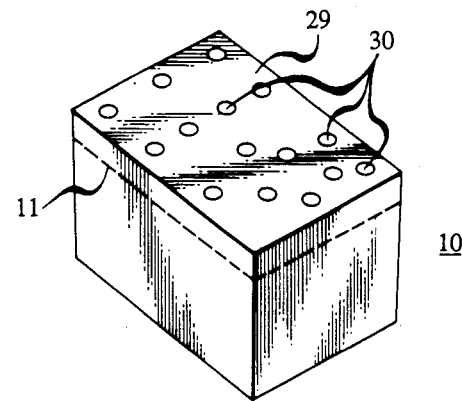
FIG. 1 is an isometric view of a LED die.

FIG. 1 is an isometric view of a LED 10 which may be of any well-known construction and could include GaAs, GaP, GaPAs, GaAlAs compound semiconductor chips having adjacent P-type and N-type semiconductor regions with a P-N junction 11 therebetween. The N-type and P-type regions are formed by well-known techniques such as diffusion, epitaxy or the like. The LED die 10 exhibits electroluminescence in the vicinity of the P-N junction 11 when charge carriers of one type are injected into a region where the predominant charge carriers are of the opposite type. Radiation is emitted in conjunction with the recombination of pairs of oppositely charged carriers.

It should be emphasized that the surface of the components to be joined with unfilled epoxy (i.e., epoxy having no metallic fillers therein) must be substantially free of insulating films, oxides or the like. Such contaminant-free surfaces are obtained and preserved for the lifetime of the assembly by coating the surfaces with a thin layer of gold. Although gold has been found to be most effective, any other noble metal may be used. Additionally, other techniques, such as cleaning the components, bonding and use of the assembly in an environment where deleterious films, oxides or the like would be prevented or placing additives in the non-conducting adhesive to remove and prevent the formation of the undesirable films as the bond site may be used.

Figure 2:
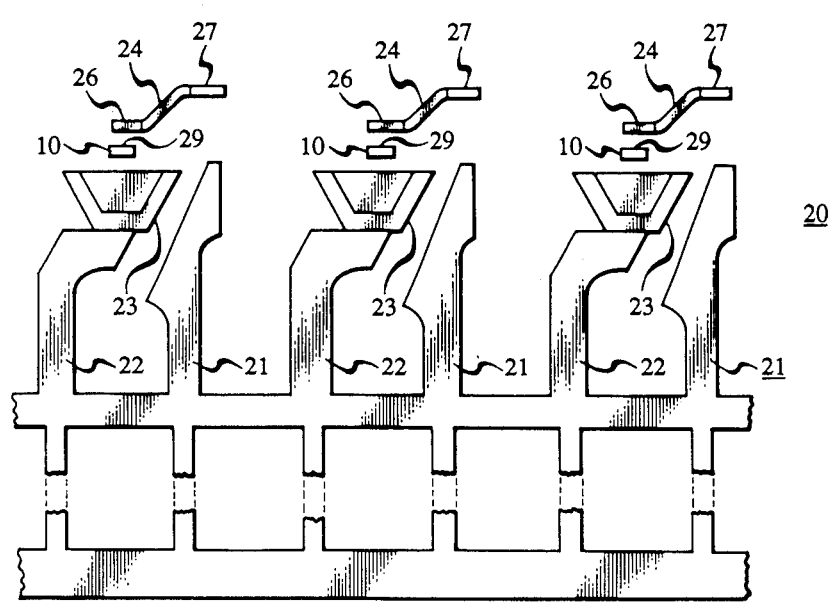
FIG. 2 is a partial cross-sectional view of a lead frame to which the die is to be bonded.

FIG. 2 depicts a lead frame, generally referred to by the numeral 20, having a plurality of first electrically conductive posts 21—21 and a second plurality of electrically conductive posts 22—22 terminating in conductive reflector cups 23—23. A plurality of interconnecting leads 24—24 having first and second ends 26 and 27, respectively, are shown in alignment with and spaced from the posts 21 and 22. In an exemplary embodiment, the leads 24—24 were 70 mils long, 5 mils wide and 1.4 mils thick with a 0.1 mil coating of gold thereon.

In an exploded portion of FIG. 2 the die 10 is shown interposed between the first ends 26—26 of the leads 24—24 and the reflector cups 23—23. The top surface 29 of the die has a number of islands 30—30 of thin gold formed thereon (see FIG. 1) to permit light generated within the die 10 to pass through the top surface. The bottom surface of the die 10 is also coated with gold, or other noble metal.

Figure 4A:
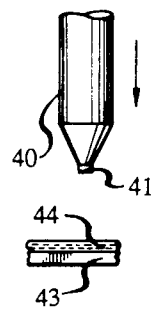
FIGS. 4A–4H set forth the steps of the instant process.
Figure 4B:
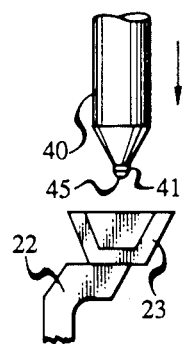
Figure 4C:
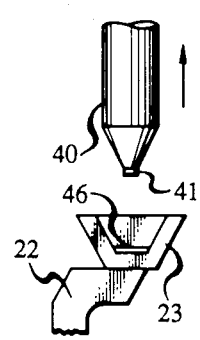
Figure 4D:
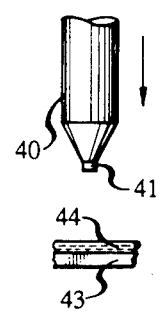
Figure 4E:
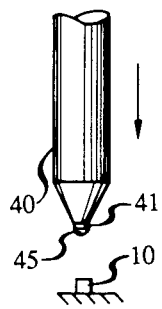
Figure 4F:
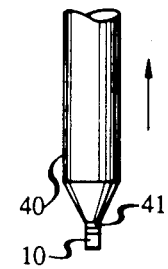
Figure 4G:
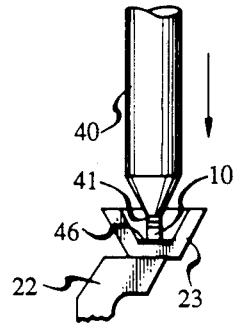
Figure 4H:
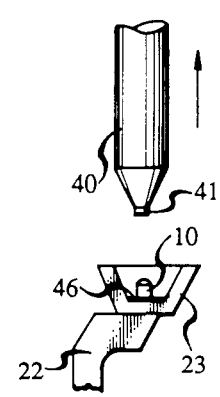

In operation, as depicted in FIGS. 4A to 4H, a solid transfer pin 40 having a narrow end 41 is dipped into a pan 43 (FIG. 4A) of adhesive 44 to form a droplet 45 (FIG. 4B) of the adhesive thereon. The end 41 of the transfer pin 40, which is 0.008 inch in diameter, is placed in contact with the bottom of the cup 23 and then withdrawn to deposit a layer 46 of the adhesive (FIG. 4C) therein. The transfer pin 40 is then dipped into the adhesive 44 (FIG. 4D) again to reform the uncured, wet adhesive droplet 45 (FIG. 4E) thereon which is then placed in contact with the top of a die 10 (FIG. 4F). The wet adhesive adheres to the die 10 sufficiently to hold the die as the pin 40 is raised. In addition to holding the die 10 it was surprisingly found that the die "floats" on the adhesive and becomes self-centered on the end 41 of the pin 40. Such self-centering aids substantially when automatically placing one or more dice 10—10 in respective cups 23—23.

The transfer pin 40 with the die 10 adhered to the wet droplet 42 is moved into alignment with a cup 23 (FIG. 4G) having the previously deposited adhesive 46 therein. The pin 40 is moved downward to place the die 10 in contact with the adhesive 46 and the pin 40 is removed leaving the die in adhesive contact with the bottom of the cup 23. Furthermore, as the pin 40 is removed the droplet 42 of adhesive remains on the die 10. Advantageously, such a technique simultaneously transfers the die 10 while applying a desired amount of uncured, wet adhesive thereon which is required in the subsequent bonding step. Such a technique not only eliminates a separate step but eliminates the use of the hypodermic needle type transfer member which undesirably clogs and results in unacceptably low yields.

Figure 3:
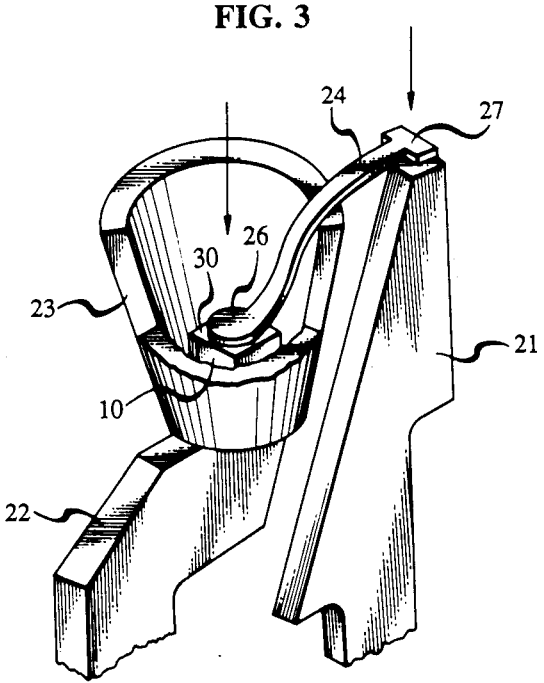
FIG. 3 is an isometric view of a die electrically connected to a lead frame terminal.

Once the die 10 is in place the lead 24 is adhesively bonded to the die and the terminal 21 as is described in the aforementioned DiLeo et al. patent and shown in FIG. 3. A force is then applied to the first and second ends 26 and 27, as indicated by arrows and the heat applied for a predetermined period of time to cure the epoxy adhesive at all the connections. It should be noted that the invention is not limited to high temperature curing; epoxies that cure at room temperature have also been used to implement the instant bonding technique.

The unfilled epoxy adhesive 44 could be used at all the bonding sites, however, unfilled epoxy need only be placed on the top surface of the die 10 for it is at this location that a filled epoxy can deleteriously affect the P-N junction 11 as hereinbefore described. Thus, it would only be necessary to apply a force at that location in order to obtain the desired connection. At locations where metal filled epoxies are used, it is not necessary to apply a clamping force. The clamping force used in the exemplary embodiment at the site (i.e., between the lead end 26 and the die 10) of the unfilled epoxy bond was 200 grams and the epoxy was subjected to a temperature between 175° C. and 185° C. for a period of about 18 minutes for curing purposes.

Figure 5:
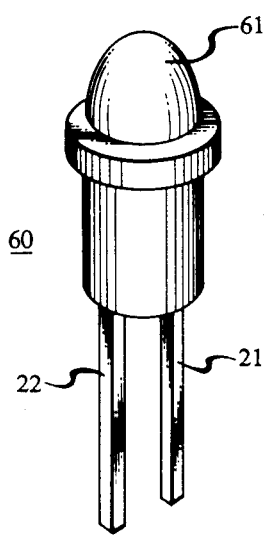
FIG. 5 is an isometric view of a LED assembly.

Once the epoxy adhesive has been cured, the bonded articles are then subjected to a conventional encapsulation process followed by a conventional cutting operation, to remove unwanted portions of the lead frame 20. Each individual LED assembly 60, shown in FIG. 5, is partially encapsulated in a transparent or translucent envelope 61, e.g., an epoxy envelope having posts 21 and 22 extending therefrom.

Figure 6:
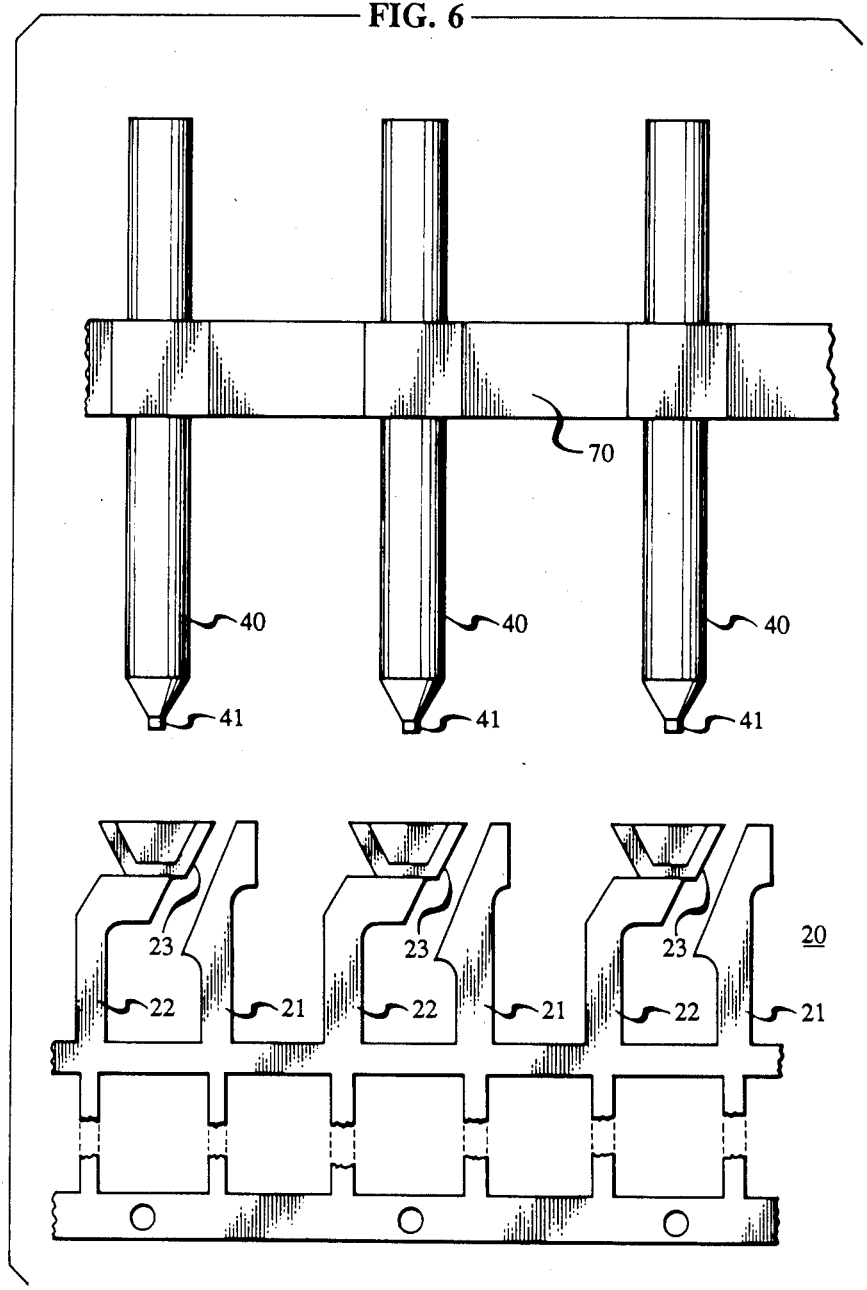
FIG. 6 depicts a technique for forming a plurality of LED assemblies.

The foregoing describes the placment of a single LED die 10 into an adhesively coated cup. FIG. 6 is a further embodiment of the invention wherein a plurality of dice 10—10 may be transferred while applying adhesive to the top portion thereof. A plurality of pins 40—40 is held in spaced, parallel relation by a planar board 70. Such an arrangement permits the pins 40—40 to be moved in concert to simultaneously perform the same operations shown for a single pin in FIGS. 4A to 4H. The lead frames 20 can be placed in adjacent, parallel rows and a board 70 holding thousands of pins 40—40 can simultaneously pick up and place a like number of dice 10—10 in cups 23—23 while applying adhesive to the top of each die.

It is to be understood that the embodiments described herein are merely illustrative of the invention. Various modifications may be made thereto by persons skilled in the art which will embody the principles of the invention and will fall within the spirit and scope thereof. For instance, although the exemplary embodiment describes the use of an unfilled adhesive for bonding, the instant technique can be implemented using a filled adhesive.

What is claimed is:

1. A method of fabricating a light emitting diode assembly (LED) having a light emitting diode die, bonded within a cup mounted on a first terminal, with an electrically conductive lead connecting the die to a second terminal which is spaced from the first terminal, the method comprising the steps of:
    depositing a wet adhesive in the cup;
    applying a wet adhesive to the end of a transfer pin;
    simultaneously applying the adhesive on the end of the transfer pin to the LED die while transferring the die into contact with the adhesive in the cup;
    removing the pin to leave adhesive on the top surface of the die while the bottom portion thereof is adhesively attached to the cup;
    adhesively bonding a first end of an electrically conductive lead to the top of the die and the second end of the lead to the second terminal; and
    subjecting the assembly to an elevated temperature for a predetermined period of time to cure the adhesive.

2. The method as set forth in claim 1 wherein the adhesive applied to the transfer pin is an unfilled epoxy adhesive, the method further comprising:
    prior to subjecting the assembly to an elevated temperature, the end of the lead is clamped into intimate contact with the die with a predetermined force sufficient to provide an electrical connection therebetween; and
    the clamping force is removed once the epoxy has been cured.

3. The method as set forth in claim 1, which comprises:
    encapsulating the cup and the second terminal with a translucent material to form a LED assembly.

4. The method as set forth in claim 2, which comprises:
    encapsulating the cup and the second terminal with a translucent material to form a LED assembly.

5. The method as set forth in claim 1 wherein:
    a plurality of LED assemblies are simultaneously fabricated.

* * * * *